United States Patent [19]

Blackwood

[11] Patent Number: 4,533,193

[45] Date of Patent: Aug. 6, 1985

[54] IDC TERMINATION FOR COAXIAL CABLE HAVING ALIGNMENT & STABILIZING MEANS

[75] Inventor: Harry P. Blackwood, Wilton, Conn.

[73] Assignee: Burndy Corporation, Norwalk, Conn.

[21] Appl. No.: 553,833

[22] Filed: Nov. 21, 1983

[51] Int. Cl.[3] ...................... H01R 13/20; H01R 11/20; H01R 43/04; H05K 3/30

[52] U.S. Cl. .................................... 339/65; 339/97 P; 339/99 R; 29/838; 29/866

[58] Field of Search ...................... 339/97 R, 97 P, 98, 339/99 R, 96, 97 C, 177 R, 177 E, 65, 66 R, 66 M, 143 R, 223 R; 29/831, 832, 837-840, 857, 861, 865-867

[56] References Cited

U.S. PATENT DOCUMENTS 2,970,184 1/1961 Blonder ........................ 339/97 R X 3,743,748 7/1973 Reeder ........................ 339/275 B X 3,805,214 4/1974 Demler, Sr. et al. ........ 339/97 R X 3,828,298 8/1974 Schumacher ................. 339/95 R X 3,915,535 10/1975 O'Keefe et al. ................... 339/17 C 4,261,632 4/1981 Narozny ......................... 339/100 X

FOREIGN PATENT DOCUMENTS 2526590 11/1982 France ............................. 339/99 R

*Primary Examiner*—Gil Weidenfeld

*Assistant Examiner*—Steven C. Bishop

*Attorney, Agent, or Firm*—Howard S. Reiter

[57] ABSTRACT

A connector for a coaxial cable and process for employing same. The connector includes first and second insulation displacement contacts which are arranged insulated from one another along a contact axis. Prongs are provided for stabilizing electrical connection between a first of the contact and a shield. The first contact also includes a system for aligning the prongs with the shield which is operative for a range of cable sizes.

27 Claims, 5 Drawing Figures

FIG. 2.
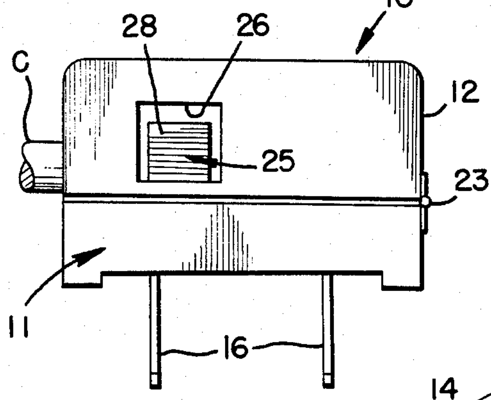
FIG. 1.
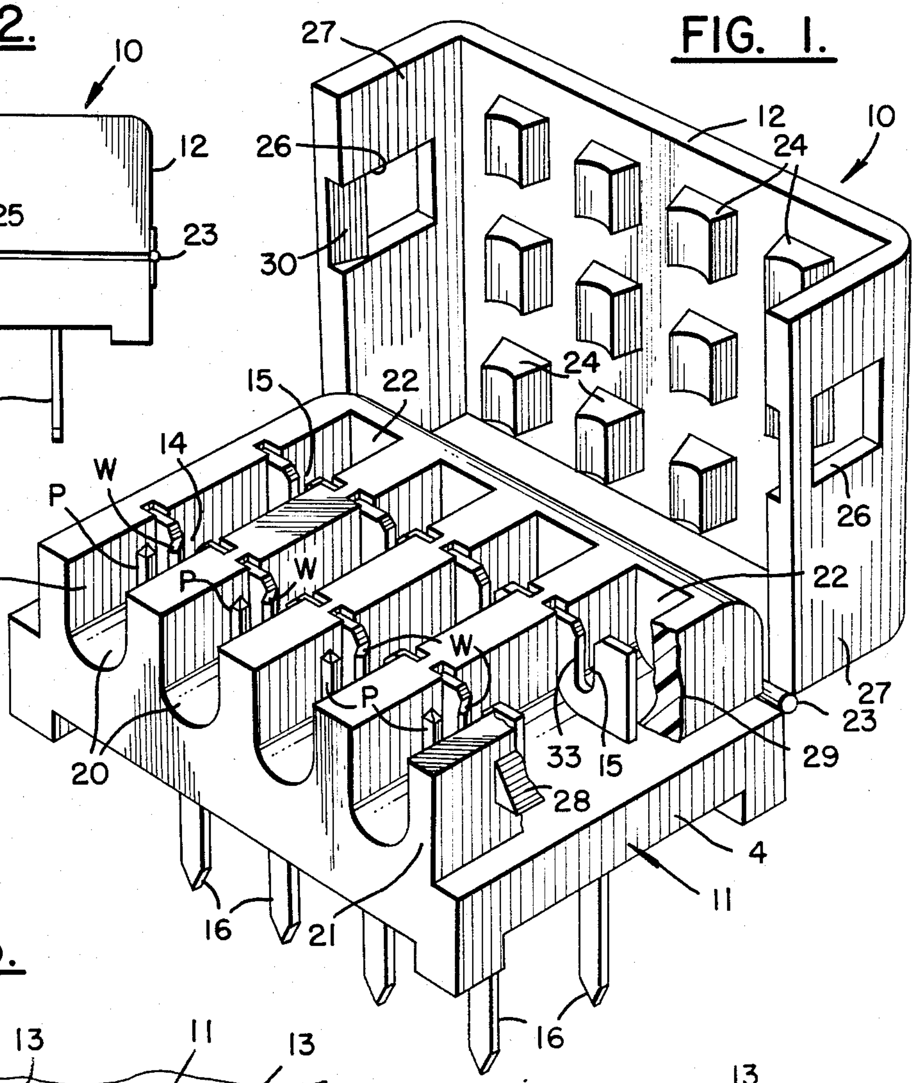
FIG. 3.
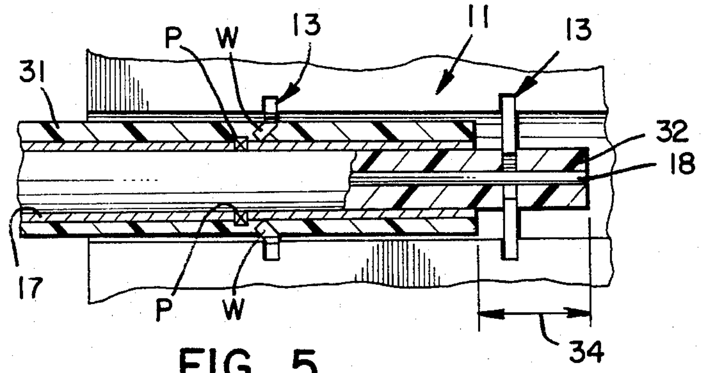
FIG. 5.
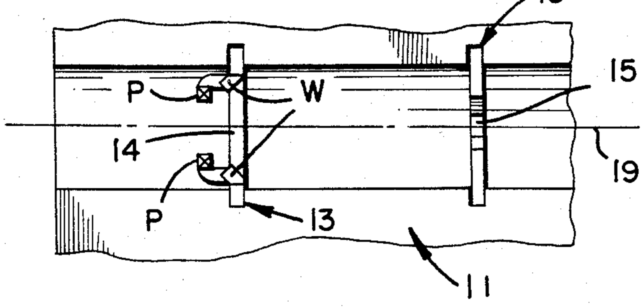
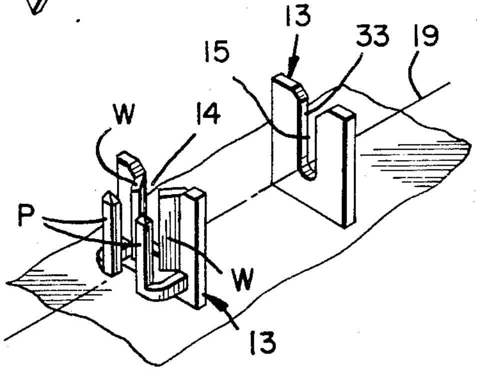
FIG. 4.

IDC TERMINATION FOR COAXIAL CABLE HAVING ALIGNMENT & STABILIZING MEANS

BACKGROUND OF THE INVENTION

This invention relates to an electrical connector for terminating a coaxial cable and, more particularly, to a coaxial cable connector for use on a printed circuit board.

Reference is hereby made to two other copending applications assigned to the same assignee as this application; "IDC Termination For Coaxial Cables" by Leonard Feldberg, Ser. No. 557,771, filed on Nov. 14, 1983, and "IDC Termination Having Means To Adapt To Various Connector Sizes" by H. Blackwood, Ser. No. 553,906, filed on Nov. 21, 1983. These cross-reference applications are incorporated herein by reference in their entirety.

Coaxial cables can comprise a single strand cable or a ribbon-type cable. In a coaxial cable, the central conductor is shielded from outside interference by a surrounding conductor which is spaced therefrom. An insulating layer separates the surrounding shield and the central conductor. An insulating jacket, in turn, surrounds the shield. The shield may be braided metallic wire or foil, etc. When the shield comprises a foil, it is known to utilize a drain wire in contact therewith for terminating the foil shielding.

Ribbon-type coaxial cables including a plurality of individual cable elements with a common outer insulating jacket are also known. As for example, the ribbon coaxial cables described in U.S. Pat. Nos. 3,963,319, to Schumacher and 4,035,050 to Volinskie. These patents also disclose electrical connectors for terminating the ribbon-type cable to a printed circuit board. The cables described in these patents employ a center conductor and drain wire lying parallel to one another. The electrical contacts of the connector are connected to the respective conductors and the wires are laterally displaced from one another. The result is an electrical connector assembly of substantial width since the contacts of the connector are spaced laterally for connection to parallel drain and central conductors.

An ordinary coaxial cable generally employs a braided shield. With respect to such cables, considerable difficulty and time is consumed in assemblying them to circuit boards. Further, the manner in which the cables must be stripped to reveal the shield and conductor can result in a mismatch of impedance.

In accordance with the prior art approach, the insulation around the braid is cut quite far back. The braid is then combed out and cut back somewhat less than the outer insulating jacket to expose the insulation around the conductor. The insulation around the conductor is then cut back about midway between the end of the braid and the end of the conductor to expose the conductor. The conductor is transmitted to the circuit board and the braid is "pig-tailed" and then joined to the circuit board.

Several problems exist in this prior art approach. The braid and the center conductor can be nipped during stripping thereby deteriorating the performance of the cable. Also, since the braid is cut back more than the central conductor, there is an impedance mis-match and this can produce a distorted signal. Obviously, the prior art process, being a multiple step manual one, is extremely time consuming and slow.

Electrical connectors employing insulation displacement contact are well known in the art and are commercially available from companies such as Burndy Corporation, Norwalk, Conn. By using insulation displacement contacts (IDCs), it is unnecessary to strip the insulation from the wire to be contacted. The contact has a blade-like configuration with a slot having a width corresponding to the diameter of the electrical conductor. When the insulated wire is pressed into the slot, the edges of the slot displace the insulation to allow intimate electrical contact between the conductor and the slot edges. The use of such insulation displacement contacts in a wide variety of electrical connectors is illustrated by reference to U.S. Pat. Nos. 3,112,147, 3,118,715, 3,434,093, 3,617,983, 3,772,635, 3,835,444, 3,836,944, 3,842,392 and 3,848,951. In some of the connectors illustrated in these patents, the insulation displacement contact includes two contact slots in axial alignment which are electrically connected to provide a redundant contact to the conductor.

SUMMARY OF THE INVENTION

In accordance with this invention, an electrical connector is provided for a coaxial cable. The cable preferably comprises at least one central conductor defining a cable axis; at least one surrounding conductive shield element; an insulating layer arranged between the shield and the conductor; and an outer insulating jacket arranged about the shield. The connector comprises a first insulation displacement contact means for electrically contacting the shield by displacement of the insulating jacket; the first contact means including means for stabilizing the electrical connection between the first contact means and the shield. Preferably, the stabilizing means comprises prongs supported by the first contact means and means are provided for aligning the prongs with the shield over a range of cable sizes. The connector further comprises a second insulation displacement contact means for electrically contacting the central conductor by displacement of the insulating layer and a contact support means comprising a base member for supporting the first and second contact means.

The contact means is arranged on the base member along a contact axis with the second contact means following the first contact means and being electrically insulated therefrom. The electrical connector thus described requires that the braid and the outer jacket be cut back more than the central conductor. However, the amount of the cut-back, is relatively small, such as on the order of approximately 1/8th of an inch, and is much less than in the prior art approach. As a result, the extent of impedance mis-match is minimized. Further, only one cut in the outer insulation and braid is required before installation of the connector, and it is not necessary to comb or "pig-tail" the braid before attaching the connector. Conventional coaxial cable stripping tools can easily perform the one cut-back operation.

Preferably, the first contact means comprises a blade-like contact member including a first slot having a first width. The slot is defined between first and second wing portions of the contact member which are slanted outwardly from the plane of the member. The wing portions comprise the aligning means. The contact member further includes first and second of the prongs being supported by the first contact member and being arranged adjacent the first and second wing portions respectively.

In one embodiment, the stabilizing means comprises a first prong arranged to be inserted in electrical contact with a first side of the shield and a second pring arranged to be inserted in electrical contact with a second and opposing side of the shield. The prongs are supported by the first contact means.

A second contact means comprises a contact having a second slot with a second width narrower than the first width. The contacts themselves can include pin portions for insertion and connection to a printed circuit board.

A cover member, preferably, snap locks onto the base to lock the coaxial cable in place. Preferably, the cover member is integrally hinged to the base and includes anvil portions for pushing the cable into the contact slots as the cover member is closed. The shield of the coaxial cable preferably comprises a braided shield and the prongs and first contact member comprise a unitary member.

The coaxial cable connector of this invention can be used for terminating a single coaxial cable or any desired number of coaxial cables.

In accordance with the process of the present invention, a coaxial cable connector is provided as described. A small portion at the end of the coaxial cable is stripped down to the insulating layer leaving an end portion of the cable including the insulating layer and central conductor and the remaining portion of the cable further including the shield and outer jacket. The stripped cable is then inserted in the connector by forcing the end portion of the cable into the second contact slot and an unstripped portion of the cable into the first contact slot. Each of the respective contacts displaces the insulation to make intimate electrical connection to the respective shield or central connector. The electrical contact between the first contact member and the shield is stabilized by insertion of the prongs into the shield.

The wing portions which define the slot act as a locator so that the prongs will always be pushed up into the braided shield over a range of coaxial cable sizes. It is not as important, in accordance with this invention, to have the edges of the slot of the first contact member to make electrical contact with the braid. The purpose of the wing portions of the contact member of slanted edges on the slot is to align the prongs to the braid. When the cable is connected to the terminal, the terminal axis corresponds to a cable axis defined by the central conductor.

Accordingly, it is an object of this invention to provide an improved electrical connector for use with a coaxial cable.

It is a further object of this invention to provide a connector as above which can be used as a coaxial cable termination on a circuit board.

It is a still further object of this invention to provide a process for connecting an electrical connector as above to a coaxial cable.

These and other objects will become more apparent from the following description and drawings.

BRIEF DESCRIPTION OF THE DRAWINGS

FIG. 1 is a perspective view of an electrical connector for coaxial cable in accordance with one embodiment of this invention.

FIG. 2 is a side view of the electrical connector in FIG. 1.

FIG. 3 is a partial top view showing a coaxial cable cross-section inserted in a set of electrical contacts of the electrical connector as in FIG. 1.

FIG. 4 is a partial perspective view showing a set of electrical contacts arranged in the base support.

FIG. 5 is a top view of the electrical contact arrangement of FIG. 4.

DETAILED DESCRIPTION OF THE PREFERRED EMBODIMENTS

Referring now to FIGS. 1–5, an electrical connector 10 is shown in accordance with the preferred embodiment of this invention. The connector 10 comprises a base member 11, a hinged cover member 12 and a plurality of electrical contacts 13. The electrical contacts 13 comprise insulation displacement contacts. Each contact 13 includes a slot 14 or 15 and pin portions 16. The pin portions 16 are adapted for insertion in respective contact holes of a printed circuit board. Each contact 13 comprises an integral metal member and is arranged in the base member so that it is electrically isolated or insulated from each of the other contacts 13. The slot 14 is relatively wider than the slot 15.

The connector 10 of this invention is particularly adapted for use with coaxial cable having a braided shield 17. The braided shield 17 comprises a loose and relatively "mushy" weave of hair-sized metallic strands which are easily moved about on the coaxial cable pushed by external elements such as contacts 13. Accordingly, slot 14 of the contact 13 may not always make sound electrical contact due to the separation of the weave of the braided shield 17. In fact, in accordance with an embodiment of this invention, it is not important to have the slot 14 make electrical contact with the braid or shield. In order to provide a means for stabilizing electrical connection between the contact 13 having the slot 14 and the braided shield 17, first and second prongs P are arranged to be inserted in the braid of the shield 17 in electrical contact therewith at a first and an opposing side of the shield 17. The prongs P are supported by the contact means 13 having the wider slot 14, preferably, and comprise a unitary member therewith.

In accordance with an embodiment of this invention, the first contact member 13 having the wide slot 14 includes first and second wing portions W which serve to define the slots 14. The wing portions W are slanted outwardly from the plane of the first contact 13 and serve as a means for aligning the coaxial cable so that the prongs are aligned with the shield over a range of cable sizes.

Coaxial cable does not have the fixed and standard sizes that are usual with plain metal conductors. The reason for this is that the shielding is normally a function of the application and its thickness and outside diameter are dimensioned accordingly. It is the aim of this invention, however, to provide a first contact member 13 which may be employed over a range of dimensions for the braided shield 17. For instance, a common way of identifying coaxial cable would be "RG/U 188" or "RG/U 178". One braid-like contact member 13 having the slot 14, as described above, could be employed over the range of coaxial cable dimensions such as including the two both above identified and perhaps even over a wider range of cable sizes.

The prongs P are supported by the contact member 13 having the wider slots 14 and, preferably, comprises a unitary member therewith. The prongs P are pushed or inserted through the metal braids 17 such that the braided material tends to close about the cross section of the prongs P providing a good stable electrical connection. The prongs P provide a side-to-side stability so that it is virtually certain that the shield 17 will always make a good ground connection. The purpose of the prongs P is to make a consistent connection with the shield 17. If the prongs are inserted into the braid 17 but the slot 14 does not make electrical contact therewith, the slot 14 will, in any event, by virtue of the wing portions P hold the prongs P into position in electrical engagement with the braid 17.

The electrical contacts 13 with the wider slots 14 and prongs P are adapted to contact the shields 17 of the coaxial cable C. The electrical contacts 13 with the narrow slots 15 are adapted to contact the central conductor 18 of the coaxial cable C.

Each coaxial cable C may have a set of contacts 13 comprising a first contact having a slot 14 and prong P and a second contact having a slot 15. The first and second contacts 13 are arranged along a contact axis 19, as shown in FIGS. 4 and 5, with a second contact having the slot 15 being arranged following the first contact 13 having the slot 14 and prong P. When the cable C is connected to the contacts 13, the contact axis corresponds to the cable axis defined by the central conductor 18. The contact axis 19 runs centrally of the slots 14 and 15.

In the embodiment shown in FIG. 1, a portion of the contacts 13, including the slots 14 or 15, are arranged within slots 20 of base member 11. Each of the slots 20 is adapted to receive a coaxial cable C. The slots 20 are defined by side walls 21 and end walls 22. A portion of the first side wall 21 has been cut away to reveal the contacts 13.

In the connector shown in FIG. 1, there are four slots 20, each including a set of contacts 13. This electrical connector is adapted to terminate four coaxial cables. Electrical connectors can be fabricated in accordance with this invention to terminate one coaxial cable or, in the alternative, any desired number of coaxial cables merely by providing the desired numbers of contact 13 sets.

The cover member 12 is hinged to the base member 11 by an integral hinge portion 23. In practice, the cover member 12, base member 11 and integral hinge 23 can be formed by molding as a single piece. Cover member 12 can include a plurality of anvil portions 24 arranged to fit within the slots 20. The anvil portions 24 serve to push the coaxial cable C into the slots 20 so as to make electrical connection to the contact 13. They also serve to clamp the cable in place to prevent it from pulling out of the connector 10.

When the cover 12 is closed as in FIG. 2, it is locked in place by means of a latch mechanism 25. The latch mechanism 25 is comprised of windows 26 in the side walls 27 of the cover member 12. Corresponding latching projections 28 extend outwardly from the side walls 29 of the base member 11. An inclined lip portion 30 is arranged at the bottom inside of each of the windows 26. When the cover member 12 is pivoted to the closed position, as shown in FIG. 2, the latching projections 28 engage the inclined lip portions 30 to spread apart the side walls 27 of the cover member until the cover is fully closed. At this time, the projections 28 seat within the windows 26 so that the side walls 27 spring back to their original shapes thereby locking the cover member 12 to the base member 11.

The electrical contacts 13 are formed of a high strength, high conductivity metal such as a copper base alloy. The contacts 13 are relatively thin so that they have a blade-like effect. When the coaxial cable C is inserted into the electrical connector 10 of this invention, the outer insulating jacket 31 and the insulating layer 32 are pierced or displaced by the edges 33 defining the slots 14 or 15 in the contacts 13. The edge 33 of slot 15 is then in intimate electrical contact with the central conductor 18. The edge 33 defining the slot 14 which comprises the free edge of the wing portions W need not make electrical contact with the shield 17 though, in view of its thin blade-like nature, it may serve as a redundant contact with the prongs P. Intimate electrical contact with the shield 17 is, of course, insured by the presence of the prongs P which serve to stabilize the electrical connection.

The process of the present invention comprises providing an electrical connector 10 which includes one or more sets of contacts 13. A portion 34 of the coaxial cable C is stripped of the outer jacket 31 and shield 17 so that the insulating layer 32 is bared. The length of the portion 34 may be relatively short, such as, for example, approximately 1/8th of an inch. The cable is then inserted in the slot 20 of the connector 10 so that the portion 34 is pressed into the slot 15 of the contact 13 while an unstripped portion of the cable C is pressed into the slot 14 of a contact 13 so that the prongs P are inserted into the shield 17 to provide a stable electrical connection. During this insertion operation, wing portions W serve to align the shield 17 with the prongs P. The cable may be placed into the slot 20 by pressing, such as by a machine or by hand, or by the action of the anvils 24 of the cover member 12 as it is pivoted into its locked position.

If the coaxial cable C comprises a ribbon-type cable including a plurality of coaxial cable elements, electrical connector 10 can be used with minor modification. The modification would comprise eliminating the intermediate side walls 21 lying between the outside side walls. While connector 10 shows only one contact 13 being used to connect to the portion 34, or the unstripped portion, of the cable, it is within the scope of this invention to employ redundant contacts electrically interconnected in place of the single contact shown for each of the contact sets.

The connectors described herein may alternatively be utilized with just the prongs P while leaving the wings W off of the connector altogether. In this case, when the cable is inserted into the slot 20 and pressed into the slot 14, the prongs P are inserted into the shield 17 thereby providing a stable electrical connection by themselves. However, the use of the wings with the prongs is preferred to assure the best possible alignment between the prongs and shield 17 in all installations.

The patents and applications described in the background of the invention herein are intended to be incorporated in their entirety by reference herein.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

I claim:

1. A connector for a coaxial cable, said cable comprising: at least one central conductor defining a cable axis;

at least one surrounding conductive shield element; a first insulating layer arranged between said shield element and said central conductor; and an outer insulating jacket arranged about said shield element; said connector comprising two independent electrical contacts each of a different structural configuration for simultaneously establishing electrical connections to said central conductor and said conductive shield including:

first insulation displacement contact means having a first means for electrically contacting said shield element by displacement of said insulating jacket, said first contact means including a second means for stabilizing the electrical connection between said first contact means and said shield element by being adapted to be positioned within said shield element;

a second insulation displacement contact means for electrically contacting said central conductor by displacement of said insulating layer; and contact support means comprising a base member for supporting said first and second contact means, said contact means being arranged on said base member along a contact axis with said second contact means following said first contact means and being electrically isolated therefrom whereby when said cable is connected to said first and second contact means said contact axis corresponds to said cable axis.

2. A connector as in claim 1 wherein said stabilizing means comprises a first prong arranged to be inserted in electrical contact with a first side of said shield element and a second prong arranged to be inserted in electrical contact with a second and opposing side of said shield element, said prongs being supported by said first contact means.

3. A connector as in claim 2 wherein said shield element comprises a braided shield and wherein said prongs and said first contact means comprise a unitary member.

4. A connector as in claim 3 wherein said first contact means comprises a member including a first slot having a first width, said prongs being arranged adjacent opposing sides of said first slot, and wherein said second contact means comprises a member having a second slot having a second width narrower than said first width and wherein said slots are arranged along said contact axis whereby said cable is adapted to be pressed into said slots.

5. A connector as in claim 4 wherein said first and second contact means comprise metal blade members further including pin-portions for connection to a printed circuit board.

6. A connector as in claim 5 further including a cover member and means for locking said cover member to said base member.

7. A connector as in claim 5 wherein said cover member is hinged to said base member to pivot between an open position for inserting said coaxial cable and a closed position for locking said coaxial cable in place and wherein said cover member includes anvil portions for engaging said cable when said cover member is closed.

8. A connector as in claim 5 wherein said first contact means and said second contact means comprise a contact set for a coaxial cable and wherein said connector includes a plurality of said contact sets.

9. A connector as in claim 8 wherein said base member includes a slot for receiving said coaxial cable and wherein said contact set is arranged within said slot.

10. A process for terminating a coaxial cable, said cable comprising: at least one central conductor defining a cable axis; at least one surrounding conductive shield element; a first insulating layer arranged between said shield element and said conductor; and an outer insulating jacket arranged about said shield element; said process comprising:

providing an electrical connector including a first insulation displacement contact means having a first means for electrically contacting said shield element by displacement of said insulating jacket, said first contact means including a second means for stabilizing the electrical connection between said first contact means and said shield element by being adapted to be positioned within said shield element, second insulation displacement contact means for electrically contacting said central conductor by displacement of said insulating layer; and a contact support means comprising a base member for supporting the first and second contact means, the contact means being arranged on the base member along a contact axis with the second contact means following the first contact means and being electrically isolated from one another;

stripping away a short portion of said outer insulating jacket and said shield element from an end portion of said coaxial cable;

inserting said end portion of said coaxial cable into said second insulation displacement contact means so that said insulating layer is displaced and said second insulation displacement contact means is in intimate electrical contact with said central conductor; and inserting an unstripped portion of said cable into said first insulation displacement contact means so that said insulating jacket is displaced by said first contact means to make intimate electrical contact with said shield element; and stabilizing the electrical connection between the first contact means and the shield element.

11. A process as in claim 10 wherein said stabilizing step comprises providing first and second prongs electrically connected to and supported by said first contact means and inserting said prongs into said shield element, as said cable is inserted into said first contact means.

12. A process as in claim 11 wherein said shield element comprises a braided shield.

13. A process as in claim 12 further including the step of locking said coaxial cable into contact with said first and second contact means.

14. A process as in claim 13 further including the step of connecting said electrical connector to a printed circuit board.

15. A connector for a coaxial cable, said cable comprising: at least one central conductor defining a cable axis; at least one surrounding conductive shield element; a first insulating layer arranged between said shield element and said central conductor; and an outer insulating jacket arranged about said shield element; said connector comprising two independent electrical contacts each of a different structural configuration for simultaneously establishing electrical connections to said central conductor and said conductive shield including:

a first insulation dislacement contact means having a first means for electrically contacting said shield element by displacement of said insulating jacket; said first contact means including a second means for stabilizing the electrical connection between said first contact means and said shield element including prongs adapted to be positioned within said shield element, and means for for aligning said prongs with said shield element over a range of cable sizes;

a second insulation displacement contact means for electrically contacting said central conductor by displacement of said insulating layer; and contact support means comprising a base member for supporting said first and second contact means, said contact means being arrannged on said base member along a contact axis with said second contact means following said first contact means and being electrically isolated therefrom, whereby when said cable is connected to said first and second contact means said contact axis corresponds to said cable axis.

16. A connector as in claim 15 wherein said first contact means comprises a blade-like member including a first slot having a first width, said slot being defined between first and second wing portions of said member which are slanted outwardly from the plane of said member, said wing portions comprising said aligning means, and first and second of said prongs being supported by said first contact means said first and second prongs being arranged adjacent said first and second wing portions respectively.

17. A connector as in claim 16 wherein said second contact means comprises a member having a second slot having a second width narrower than said first width and wherein said slots are arranged along said contact axis whereby said cable is adapted to be pressed into said slots.

18. A connector as in claim 17 wherein said contacts comprise blade-like metal members further including pin-portions for connections to a printed circuit board.

19. A connector as in claim 18 further including a cover member and means for locking said cover member to said base member.

20. A connector as in claim 19 wherein said cover member is hinged to said base member to pivot between an open position for inserting said coaxial cable and a closed position for locking said coaxial cable in place and wherein said cover member includes anvil portions for engaging said cable when said cover member is closed.

21. A connector as in claim 19 wherein said first contact means and said second contact means comprise a contact set for a coaxial cable and wherein said connector includes a plurality of said contact sets.

22. A connector as in claim 21 wherein said base member includes a slot for receiving said coaxial cable and wherein said contact set is arranged within said slot.

23. A process for terminating a coaxial cable, said cable comprising: at least one central conductor defining a cable axis; at least one surrounding conductive shield element; a first insulating layer arranged between said shield element and said conductor; and an outer insulating jacket arranged about said shield element; said process comprising:

providing an electrical connector including a first insulation displacement contact means having a means for electrically contacting said shield element by displacement of said insulating jacket; said first contact means including a means comprising prongs to stabilize the electrical connection between said first contact means and said shield element, the prongs being adapted to be positioned within said shield element and means for aligning said prongs with said shield element over a range of cable sizes; second insulation displacement contact means for electrically contacting said central conductor by displacement of said insulating layer; and contact support means comprising a base member for supporting the first and second contact means, the contact means being arranged on the base member along a contact axis with the second contact means following the first contact means and being electrically isolated from one another;

stripping away a short portion of said outer insulating jacket and said shield element from an end portion of said coaxial cable;

inserting said end portion of said coaxial cable into said second insulation displacement contact means so that said insulating layer is displaced and said second insulation displacement contact means is in intimate electrical contact with said central conductor; and inserting an unstripped portion of said cable into said first insulation displacement contact means so that said insulating jacket is displaced by said first contact means and said prongs are inserted in said shield element to make intimate electrical contact with said shield element; and aligning the prongs with the shield irrespective of cable size in a desired range.

24. A process as in claim 23 wherein said step of providing said first contact means comprises providing a blade-like member including a first slot having a first width, said slot being defined between first and second wing portions of said contact means which are slanted outwardly from the plane of said member said wing portions comprising said aligning means.

25. A process as in claim 24 wherein said shield element comprises a braided shield.

26. A process as in claim 25 further including the step of locking said coaxial cable into contact with said first and second contact means.

27. A process as in claim 26 further including the step of connecting said electrical connector to a printed circuit board.

* * * * *